(12) United States Patent
Iwamoto

(10) Patent No.: US 7,802,140 B2
(45) Date of Patent: Sep. 21, 2010

(54) DIAGNOSTIC PROGRAM, A SWITCHING PROGRAM, A TESTING APPARATUS, AND A DIAGNOSTIC METHOD

(75) Inventor: Satoshi Iwamoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 707 days.

(21) Appl. No.: 11/114,927

(22) Filed: Apr. 26, 2005

(65) Prior Publication Data
US 2006/0224926 A1 Oct. 5, 2006

(30) Foreign Application Priority Data
Mar. 30, 2005 (JP) ............................. 2005-100018

(51) Int. Cl.
*G06F 11/00* (2006.01)
(52) U.S. Cl. ....................................................... 714/27
(58) Field of Classification Search ................... 714/32, 714/27
See application file for complete search history.

(56) References Cited

U.S. PATENT DOCUMENTS

| 3,953,717 | A | * | 4/1976 | Rottier et al. ................. 714/46 |
| 4,488,299 | A | | 12/1984 | Fellhauer et al. |
| 4,706,208 | A | * | 11/1987 | Helms ......................... 702/118 |
| 5,991,897 | A | * | 11/1999 | Perugini et al. ................ 714/27 |
| 6,385,739 | B1 | * | 5/2002 | Barton et al. ................. 714/25 |
| 6,480,978 | B1 | * | 11/2002 | Roy et al. .................... 714/724 |
| 6,574,764 | B2 | * | 6/2003 | Krech et al. ................. 714/738 |
| 6,587,983 | B1 | * | 7/2003 | Nakayama .................. 714/736 |
| 6,591,385 | B1 | * | 7/2003 | Krech et al. ................. 714/718 |
| 6,643,798 | B2 | * | 11/2003 | Barton et al. ................. 714/25 |
| 6,647,526 | B1 | * | 11/2003 | Holder et al. ................ 714/743 |

(Continued)

FOREIGN PATENT DOCUMENTS

JP 03-037582 A 2/1991

(Continued)

OTHER PUBLICATIONS

STC Semiconductor Test Consortium, "STC Announces Public Access to the Openstar™ Specifications," Press Release, San Diego, CA, Nov. 30, 2004, found at www.semitest.org (2 pages).

(Continued)

*Primary Examiner*—Robert Beausoliel
*Assistant Examiner*—Amine Riad
(74) *Attorney, Agent, or Firm*—Osha• Liang LLP

(57) ABSTRACT

A diagnostic program includes a first software module that diagnoses a diagnostic object test module; a plurality of second software modules respectively corresponding to the type of the non-diagnostic object test module, and controlling the non-diagnostic object test module to receive a signal for diagnosis output by the diagnostic object test module or to output a signal for diagnosis to the diagnostic object test module; a third software module specifying the second software module that corresponds to the type of the non-diagnostic object test module, in response to a call received from said first software module which instructs said third software module to receive the signal for diagnosis from or send the signal for diagnosis to the non-diagnostic object test module; and a fourth software module which calls the second software module specified by said third software module, and causes the signal for diagnosis to be input or output.

7 Claims, 7 Drawing Sheets

U.S. PATENT DOCUMENTS

| | | | |
|---|---|---|---|
| 6,671,844 B1 * | 12/2003 | Krech et al. | 714/736 |
| 6,687,861 B1 * | 2/2004 | Jordan et al. | 714/718 |
| 6,763,490 B1 * | 7/2004 | Krech et al. | 714/738 |
| 6,779,140 B2 * | 8/2004 | Krech et al. | 714/718 |
| 6,851,076 B1 * | 2/2005 | Cook et al. | 714/718 |
| 7,076,714 B2 * | 7/2006 | Cook et al. | 714/742 |
| 7,080,356 B2 * | 7/2006 | Atallah et al. | 717/124 |
| 7,152,186 B2 * | 12/2006 | Airaud et al. | 714/30 |
| 7,171,587 B2 * | 1/2007 | Hlotyak et al. | 714/30 |
| 7,210,087 B2 * | 4/2007 | Mukai et al. | 714/742 |
| 7,213,175 B2 * | 5/2007 | Morrison et al. | 714/38 |
| 7,302,282 B2 * | 11/2007 | McKim et al. | 455/575.1 |
| 7,536,596 B2 * | 5/2009 | Johnson | 714/28 |
| 2002/0091966 A1 * | 7/2002 | Barton et al. | 714/25 |
| 2003/0005375 A1 * | 1/2003 | Krech et al. | 714/724 |
| 2003/0093718 A1 * | 5/2003 | Sutton | 714/38 |
| 2003/0167422 A1 * | 9/2003 | Morrison et al. | 714/38 |
| 2003/0208710 A1 * | 11/2003 | Martin-de-Nicolas et al. | 714/736 |
| 2003/0229825 A1 * | 12/2003 | Barry et al. | 714/38 |
| 2004/0193990 A1 * | 9/2004 | Ichiyoshi | 714/742 |
| 2004/0210798 A1 * | 10/2004 | Higashi | 714/27 |
| 2004/0215361 A1 * | 10/2004 | Hlotyak et al. | 700/121 |
| 2004/0221214 A1 | 11/2004 | Shibuya | |
| 2005/0015666 A1 * | 1/2005 | Kamani et al. | 714/25 |
| 2005/0034043 A1 * | 2/2005 | Takizawa | 714/742 |
| 2005/0039079 A1 * | 2/2005 | Higashi et al. | 714/28 |
| 2005/0091562 A1 * | 4/2005 | Krishnamoorthy et al. | 714/724 |
| 2005/0125709 A1 * | 6/2005 | McKim et al. | 714/25 |
| 2006/0026465 A1 * | 2/2006 | Kwong et al. | 714/38 |

FOREIGN PATENT DOCUMENTS

| | | |
|---|---|---|
| JP | 06-281692 A | 10/1994 |
| JP | 10-150082 A | 6/1998 |
| JP | 11-118879 A | 4/1999 |
| JP | 11-304880 A | 11/1999 |
| JP | 2002-174663 | 6/2002 |
| JP | 2004-163194 | 6/2004 |
| WO | 02/46785 A | 6/2002 |
| WO | 2004/072669 A1 | 8/2004 |
| WO | 2004/090562 A1 | 10/2004 |
| WO | 2004086071 A1 | 10/2004 |

OTHER PUBLICATIONS

Japanese Language Office Action for Application No. PCT/JP2006/305679, Dated Jun. 27, 2006 (2 pages).

Supplementary European Search Report from Application No. 06729646.7 dated Dec. 8, 2008 (7 pages).

English Abstract of JP11118879A dated Apr. 30, 1999; Toshiba Micro Electronics et al. (1 page).

English Abstract of JP11304880A dated Nov. 5, 1999; Advantest Corp. (1 page).

English Abstract of JP10150082A dated Jun. 2, 1998; Advantest Corp. (1 page).

English Abstract of JP3037582A dated Feb. 18, 1991; Mitsubishi Electric Corp. (1 page).

English Abstract of JP 6281692A dated Oct. 7, 1994; Advantest Corp. (1 page).

English Abstract of WO2002/046785A1 dated Jun. 13, 2002; Advantest Corp. (1 page).

Japanese Office Action for Application No. 2005-100018, mailed on Mar. 23, 2010 (4 pages).

* cited by examiner

DIAGNOSTIC PROGRAM, A SWITCHING PROGRAM, A TESTING APPARATUS, AND A DIAGNOSTIC METHOD

CROSS REFERENCE TO THE RELATED APPLICATION

This patent application claims priority from a Japanese patent application No. 2005-100018 filed on Mar. 30, 2005, the contents of which are incorporated herein by reference.

BACKGROUND OF THE INVENTION

1. Field of the Invention

The present invention relates to a diagnostic program, a switching program, a testing apparatus, and a diagnostic method. More particularly, the present invention relates to a diagnostic program, a switching program, a testing apparatus, and a diagnostic method for diagnosing a test module and the testing apparatus includes a plurality of test modules for providing a device under test with a test signal and a control apparatus for controlling the plurality of test modules.

2. Description of the Related Art

A testing apparatus for testing a device under test ("DUT") such as a memory, a logic LSI, or a Soc (System on Chip) determines pass/fail of the DUT, for example, by providing a test signal to the input terminal of the DUT and comparing an output signal output from the output terminal in response to the test signal with an expectation value. For a conventional testing apparatus, the kind (or type) of a test module for inputting and outputting a signal between the testing apparatus and a DUT is fixedly determined according to the position of a slot of a main frame of the testing apparatus in which the test module is inserted.

A testing apparatus has a diagnostic function of judging normality or abnormality. The testing apparatus diagnoses function of each test module as normality or abnormality during a diagnostic operation. For the diagnosis of a test module which is an object to be diagnosed, an input and output test is performed to input a signal for diagnosis output by the test module to another test module to compare with an expectation value and input a signal for diagnosis output by another test module to the test module to compare with an expectation value, for example.

Conventionally, a method for executing a diagnostic program on a control apparatus of a testing apparatus and diagnosing each part of the testing apparatus has been used with the object of detecting a fault of the testing apparatus. Here, the kind of a test module inserted into each slot of the conventional testing apparatus is predetermined. Thus, conventionally, an object diagnostic program for diagnosing a test module which is an object to be diagnosed inputs and outputs a signal for diagnosis between the test module to be diagnosed and a known test module. In other words, the object diagnostic program performs input and output of a signal for diagnosis between the test module to be tested and another test module of a predetermined kind by calling a signal for diagnosis input and output program for controlling another test module.

With regard to this, recently, an open architecture such as OPENSTAR (registered trademark) with the object of increasing degree of freedom of the configuration of a testing apparatus is suggested (for example, see Semiconductor Test Consortium, "STC ANNOUNCES PUBLIC ACCESS TO THE OPENSTAR™ SPECS", [ONLINE], Dec. 7, 2004, [searched on Mar. 16, 2005], internet<URL:http://www.semitest.org/site/News/STC_Spec_Open_to_Public>).

For a testing apparatus using the open architecture, it is possible to place various kinds of test modules based on the open architecture in each slot. In case this kind of testing apparatus is programmed so as to call a signal for diagnosis input and output program for controlling another test module of a predetermined kind from an object diagnostic program of a test module which is an object to be tested similarly with the conventional testing apparatus, it is impossible to properly diagnose the test module if another test module provided in the testing apparatus is changed. Therefore, it is required to change the object diagnostic program when another test module is changed.

SUMMARY OF THE INVENTION

Therefore, it is an object of the present invention to provide a semiconductor device, a testing apparatus, and a measuring method, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a diagnostic program of a testing apparatus comprising a plurality of test modules for providing a device under test with a test signal and a control apparatus for controlling the plurality of test modules is provided, wherein the diagnostic program makes the control apparatus diagnose the plurality of test modules and includes: an object diagnostic software module for making the control apparatus diagnose a test module which is an object to be diagnosed; a signal for diagnosis input and output software module which is provided in each kind of test module which is not the object to be diagnosed and which outputs a signal for diagnosis to the test module which is the object to be diagnosed or makes the control apparatus control the test module which is not the object to be diagnosed so that the signal for diagnosis output by the test module which is the object to be diagnosed is input to the test module which is not the object to be diagnosed; a kind specification software module (or type specification software module) for making the control apparatus specify the signal for diagnosis input and output software module which corresponds to the kind of the test module which is not the object to be diagnosed, in response to a call received from the object diagnostic software module which instructs the kind specification software module to receive the signal for diagnosis from or send the signal for diagnosis to the test module which is not the object to be diagnosed; and a call destination switching software module for making the control apparatus call the signal for diagnosis input and output software module specified the kind specification software module, making the test module which the object to be tested input the signal for diagnosis to the test module which is not the object to be tested, and making the test module which is not the object to be tested output the signal for diagnosis to the test module which the object to be tested.

The kind specification software module may search for a configuration file storing software module identification information for identifying the second software module corresponding to each of the plurality of test modules of the testing apparatus, which is stored on the control apparatus, and retrieve the identification information of the second software module corresponding to the test module which is not the object to be diagnosed.

The diagnostic program may further include a third software module for making the control apparatus retrieve kind identification information for identifying the kind of each of the plurality of test modules of the testing apparatus stored in the test module, and a configuration file writing software module for storing software module identification information for identifying the second software module corresponding to the test module in the configuration file on the basis of the kind identification information retrieved by the third software module for each of the plurality of test modules of the testing apparatus.

In case one non-diagnostic object test module makes more than two second software modules executed on the control apparatus to receive or send the signal for diagnosis, the call destination switching software module may make the control apparatus call sequentially the more than two second software modules in response to a call for instructing it to receive/send the signal for diagnosis from/to the non-diagnostic object test module.

According to the second aspect of the present invention, a switching program of a testing apparatus including a plurality of test modules for providing a device under test with a test signal and a control apparatus for controlling the plurality of test modules is provided, the switching program switching a second software module for making the control apparatus control a test module which is not an object to be diagnosed and which is called from an object diagnostic software module for making the control apparatus diagnose a diagnostic object test module, wherein the second software module is provided in each kind of non-diagnostic object test module and which outputs a signal for diagnosis to the diagnostic object test module or makes the control apparatus control the non-diagnostic object test module so that the signal for diagnosis output by the diagnostic object test module is input to the non-diagnostic object test module, and the switching program includes: a kind specification software module for making the control apparatus specify the second software module which corresponds to the kind of the non-diagnostic object test module, in response to a call received from the object diagnostic software module which instructs the kind specification software module to receive the signal for diagnosis from or send the signal for diagnosis to the non-diagnostic object test module; and a call destination switching software module for making the control apparatus call the second software module specified the kind specification software module, making the test module which the object to be tested input the signal for diagnosis to the non-diagnostic object test module, and making the non-diagnostic object test module output the signal for diagnosis to the test module which the object to be tested.

According to the third aspect of the present invention, a testing apparatus for testing a device under test includes: a plurality of test modules for providing the device under test with a test signal; and a control apparatus for controlling the plurality of test modules diagnostic program of a testing apparatus, wherein the control apparatus executes a diagnostic program for diagnosing the test module and thus perform function of an object diagnostic section for making the control apparatus diagnose a test module which is an object to be diagnosed; a signal for diagnosis input and output section which is provided in each kind of non-diagnostic object test module and which makes the non-diagnostic object test module output a signal for diagnosis to the diagnostic object test module or makes the signal for diagnosis output by diagnostic object test module is input to the non-diagnostic object test module; a kind specification section for making the control apparatus specify the signal for diagnosis input and output section which corresponds to the kind of the non-diagnostic object test module, in response to a call received from the object diagnostic section which instructs the kind specification section to receive the signal for diagnosis from or send the signal for diagnosis to the non-diagnostic object test module; and a call destination switching section for making the control apparatus call the signal for diagnosis input and output section specified the kind specification section, making the test module which the object to be tested input the signal for diagnosis to the non-diagnostic object test module, and making the non-diagnostic object test module output the signal for diagnosis to the test module which the object to be tested.

According to the fourth aspect of the present invention, a diagnostic method by a testing apparatus include a plurality of test modules for providing a device under test with a test signal and a control apparatus for controlling the plurality of test modules, the diagnostic method makes the control apparatus diagnose the plurality of test modules and includes: an object diagnostic step of making the control apparatus diagnose a test module which is an object to be diagnosed; a signal for diagnosis input and output step which is provided in each kind of non-diagnostic object test module and which outputs a signal for diagnosis to the diagnostic object test module or makes the control apparatus control the non-diagnostic object test module so that the signal for diagnosis output by the diagnostic object test module is input to the non-diagnostic object test module; a kind specification step of making the control apparatus specify the signal for diagnosis input and output step which corresponds to the kind of the non-diagnostic object test module, in response to a call received from the object diagnostic step which instructs the kind specification step to receive the signal for diagnosis from or send the signal for diagnosis to the non-diagnostic object test module; and a call destination switching step of making the control apparatus call the signal for diagnosis input and output step specified the kind specification step, making the test module which the object to be tested input the signal for diagnosis to the non-diagnostic object test module, and making the non-diagnostic object test module output the signal for diagnosis to the test module which the object to be tested.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
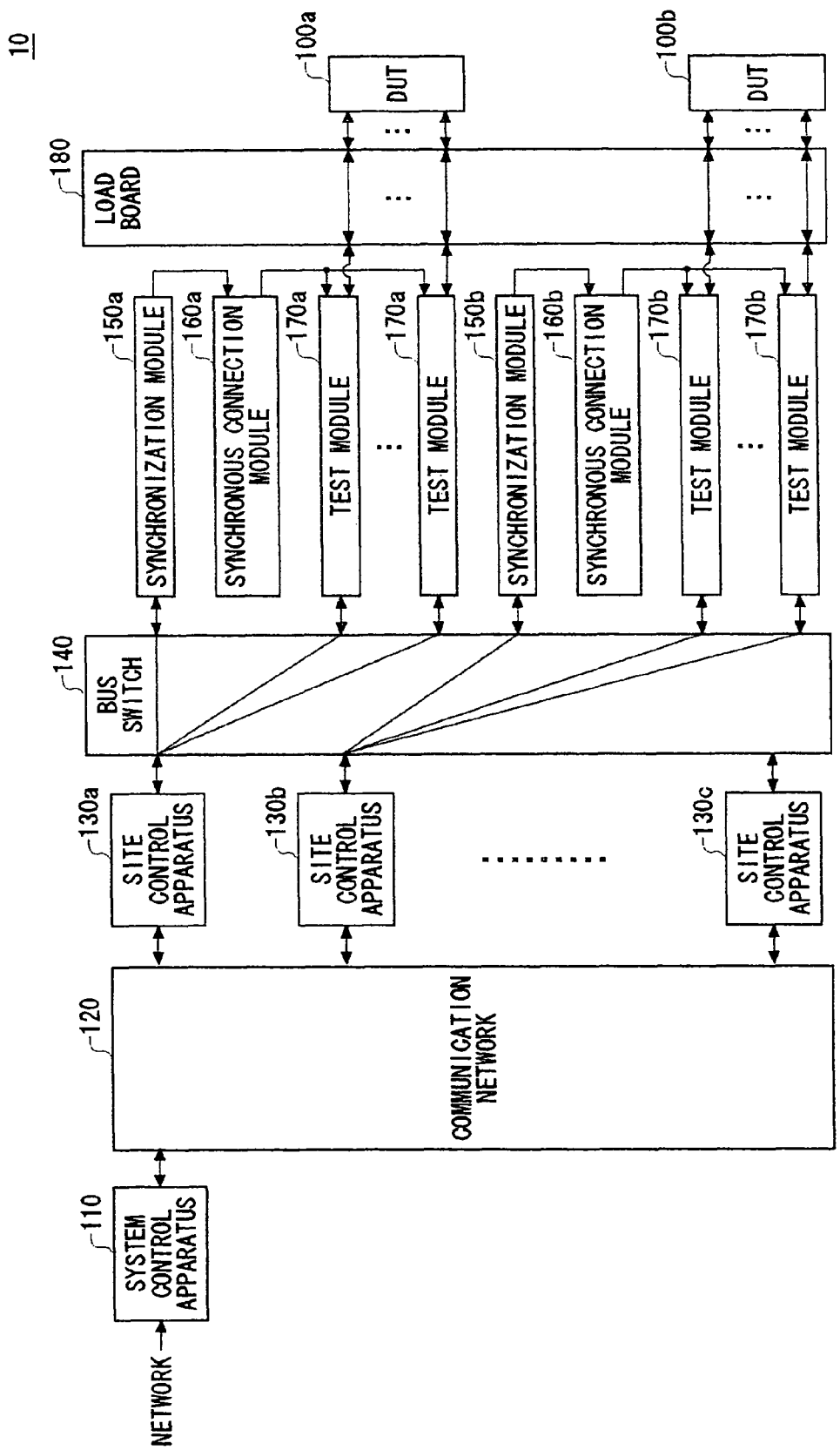
FIG. 1 shows the configuration of a testing apparatus 10 according to an embodiment of the present invention.

FIG. 1 shows the configuration of a testing apparatus 10 according to an embodiment of the present invention. The testing apparatus 10 generates a test signal and provides with a Device Under Test ("DUT") 100 with it. The testing apparatus 10 determines pass/fail of the DUT 100 on the basis of whether or not an output signal, which the DUT 100 outputs as a result of operating according to the test signal, coincides with an expectation value. The testing apparatus 10 according to the present embodiment is realized by an open architecture and may use various modules based on the open architecture as a test module 170 for providing the DUT with the test signal and the like.

The testing apparatus 10 includes a system control apparatus 110, a communication network 120, site control apparatus 130a to 130c, a bus switch 140, synchronization modules 150a and 150b, synchronous connection modules 160a and 160b, test modules 170a and 170b, and a load board 180, and is connected with the DUTs 100a and 100b. Each of the synchronization modules 150a and 150b, the synchronous connection modules 160a and 160b, the test modules 170a and 170b is an example of a test module according to the present invention.

The system control apparatus 110 receives a test control program, a test program, and a test data used by the testing apparatus 10 for testing on the DUTs 100a and 100b and a diagnostic program for diagnosing the inside of the testing apparatus 10 through a network of the outside and stores them. The communication network 120 connects the system control apparatus 110 and the site control apparatus 130a to 130c, and relays communication among them.

Each of the site control apparatus 130a to 130c is an example of a control apparatus according to the present invention and controls the testing on the DUT 100 by controlling the synchronization module 150, the synchronous connection module 160, and the test module 170. Here, each of the plurality of site control apparatus 130 controls the testing on each of the DUTs 100. For example, according to FIG. 1, the site control apparatus 130a and 130b control the testing on the DUT 100a and 100b, respectively. Instead, each of the plurality of site control apparatus 130 may control testing on a plurality of DUTs 100.

More specifically, the site control apparatus 130 gets a test control program from the system control apparatus 110 via the communication network 120 and executes it. Then, the site control apparatus 130 gets a test program and a test data used for the testing on the DUT 100 from the system control apparatus 110 on the basis of the test control program and stores them in modules such as the synchronization module 150 and one or a plurality of test modules 170 used for the testing on the DUT 100 via the bus switch 140. Then, the site control apparatus 130 instructs the synchronization module 150 to start testing based on the test program and the test data via the bus switch 140. Then, the site control apparatus 130 receives an interrupt showing that the testing is finished and the like, for example, from the synchronization module 150 and makes each module conduct next testing on the basis of the test result. In the above, the site control apparatus 130 controls the testing operation of each of the synchronization module 150 and the plurality of test modules 170 by executing a software module for testing (hereinafter, the software module is referred to the "SW module").

Further, each of the site control apparatus 130a to 130c executes a diagnostic program and diagnoses the testing apparatus. For the diagnostic process, each of the plurality of site control apparatus 130 diagnoses the synchronization module 150, the synchronous connection module 160, and the test module 170 which are connected with the site control apparatus 130 via the bus switch 140. For the diagnosis of each of the test modules 170, the site control apparatus 130 makes a signal for diagnosis transferred between the test module 170 which is a diagnostic object and a non-diagnostic test module 170 which is not the diagnostic object. Then, pass/fail of the output channel of the diagnostic object test module 170 is determined on the basis of the result of comparing a signal for diagnosis output by the diagnostic object test module 170 and taken by the non-diagnostic object test module 170 with an expectation value. Further, pass/fail of the input channel of the diagnostic object test module 170 is determined on the basis of the result of comparing a signal for diagnosis output by the non-diagnostic object test module 170 and taken by the diagnostic object test module 170 with an expectation value.

The bus switch 140 connects each of the plurality of site control apparatus 130 with the synchronization module 150 and one or a plurality of test modules 170 and relays communication among them. Here, one predetermined site control apparatus 130 may set the bus switch so that the bus switch connects each of the plurality of site control apparatus 130 with the synchronization module 150 used for the testing on the DUT 100 by the site control apparatus 130 and more than one test modules 170 on the basis of an instruction from a user of the testing apparatus 10 or a test control program. For example, in FIG. 1, the site control apparatus 130a is set so as to be connected with the synchronization module 150a and a plurality of test modules 170a and performs testing on the DUT 100a using them. Further, the site control apparatus 130b is set so as to be connected with the synchronization module 150b and a plurality of test modules 170b and performs testing on the DUT 100b using them.

Here, since the configuration and the operation of the site control apparatus 130b for testing the DUT 10Db using the synchronization module 150b, the synchronous connection module 160b, and one or a plurality of test modules 170b are substantially similar with those of the site control apparatus 130a for testing the DUT 100a using the synchronization module 150a, the synchronous connection module 160a, and one or a plurality of test modules 170a, the configuration and the operation of the site control apparatus 130a for testing the DUT 100a are will be mainly described except for differences between them in the following.

The synchronization module 150a generates a test signal generation timing at which the plurality of test modules 170a used for testing the DUT 100a should generate a test signal on the basis of an instruction of the site control apparatus 130a. Further, the synchronization module 150a receives the test result(s) from one or the plurality of the test modules 170a via the synchronous connection module 160a and makes one or the plurality of the test modules 170a execute a program sequence corresponding to pass/fail of the test result.

The synchronous connection module 160a informs the test module 170a which should operate according to the test signal generation timing of the test signal generation timing generated by the synchronization module 150a and makes one or each of the plurality of test modules 170a operate at the appointed timing. Further, the synchronous connection module 160a receives the test result(s) from one or the plurality of test modules 170a and sends the result(s) to the synchronization module 150a.

Each of the plurality of test modules 170a is connected with a part of a plurality of terminals of the DUT 100a and performs testing on the DUT 100a on the basis of the test program and the test data stored in the site control apparatus 130a. For the testing on the DUT 100a, the test module 170a generates a test signal from the test data on the basis of a sequence predetermined by the test program and provides the terminal of the DUT 100a connected with the test module 170a with the test signal. Then, the test module 170a gets an output signal output by the DUT 100a as a result of operation based on the test signal compares the output signal with an expectation value. Then, the test module 170a sends the result of comparing the output signal and the expectation value to the synchronous connection module 160a as a test result. Here, since the plurality of test modules 170a change the cycle frequency of the test signal dynamically on the basis of the test program and the test data, the plurality of test modules 170a generate test signals on the basis of different cycle frequency.

Further, in case the process of the test program is completed or there is abnormality during executing the test program, the test module 170a generates an interrupt with respect to the site control apparatus 130a. The site control apparatus 130a corresponding to the test module 170a is informed of the interrupt via the bus switch 140 and an interrupt process is conducted by a processor of the site control apparatus 130a.

The plurality of DUTs 100 are mounted on the load board 180 and the load board 180 is connected with terminals of the DUT 100 corresponding to the plurality of test modules 170. Here, in case of diagnosing the testing apparatus 10, a load board for diagnosis may be used instead of a load board for conventional testing. The load board for diagnosis may have a configuration for connecting the diagnostic object test module 170 and the non-diagnostic object test module 170 directly.

By this, the testing apparatus 10 is realized by an open architecture and can use various modules satisfying the open architecture standard. Further, the testing apparatus 10 can use modules such as the synchronization module 150, the synchronous connection module 160, and the test module 170 by inserting them into any connection slots of the bus switch 140. At this time, the user of the testing apparatus 10 can change the type of the connection of the bus switch 140, for example, via the site control apparatus 130a and connect a plurality of modules used for testing on the DUT 100 with the site control apparatus 130 which controls the testing on the DUT 100. Thus, the user of the testing apparatus 10 can select a module proper for such a thing as the number of terminals, arrangement of the terminals, the kind of the terminal or the kind of the testing of each of the plurality of DUTs 100 and provide in the testing apparatus 10.

Further, instead of the above, the synchronous connection modules 160a and 160b maybe realized by one synchronous connection module common to the whole test modules 170 used for the testing apparatus 10. In this case, the user of the testing apparatus 10 can select a module proper for characteristics of the plurality of DUTs 100 by changing the type of connection between the synchronous connection module and the test module 170 as well as the type of the connection of the bus switch 140.

Figure 2:
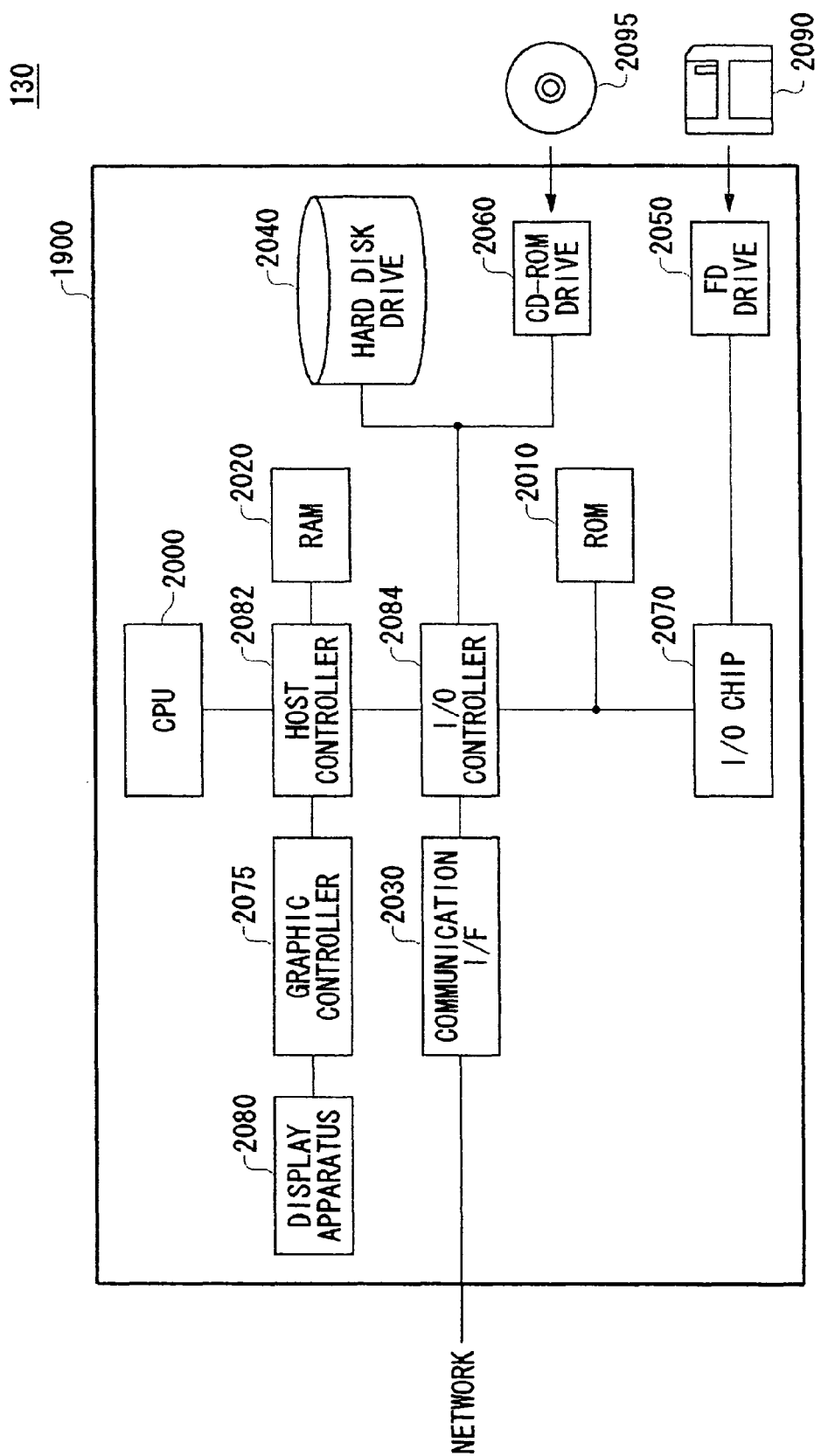
FIG. 2 shows the configuration of a site control apparatus 130 according to the embodiment of the present invention.

FIG. 2 shows the configuration of hardware of the site control apparatus 130 according to the present embodiment. A computer 1900 operating as the site control apparatus 130 comprises a CPU peripheral part including a CPU 2000, a RAM 2020, a graphic controller 2075, and a display apparatus 2080 which are interconnected by a host controller 2082, an input and output part including a communication I/F 2030, a hard disk drive 2040, and a CD-ROM drive 2060 which are connected to host controller 2082 by an I/O controller 2084, and a legacy I/O part including a ROM 2010, a flexible disk drive 2050, and a I/O chip 2070 which are connected to the I/O controller 2084.

The host controller 2082 connects the RAM 2020 with the CPU 2000 having access to the RAM 2020 at high transmission rate and the graphic controller 2075. The CPU 2000 operates on the basis of programs stored in the ROM 2010 and the RAM 2020 controls each part. The graphic controller 2075 gets image data generated on a frame buffer provided in the RAM 2020 by the CPU 2000 and the like and displays on the display apparatus 2080. Instead, the graphic controller 2075 may include a frame buffer storing image data generated by the CPU 2000 and the like therein.

The I/O controller 2084 connects the host controller 2082, the communication interface 2030 which is a relatively high speed I/O apparatus, the hard disk drive 2040, and the CD-ROM drive 2060. The communication interface 2030 communicates with another apparatus via a network. The hard disk drive 2040 stores a program and data used by the CPU 2000 in the computer 1900. The CD-ROM drive 2060 retrieves a program or data from a CD-ROM 2095 and provides the hard disk drive 2040 with it via the RAM 2020.

Further, the ROM 2010, the flexible disk drive 2050, and the I/O chip 2070, which are relatively low speed I/O apparatus, are connected with the I/O controller 2084. The ROM 2010 stores a boot program which the computer 1900 executes when it starts to operate, a program depending on hardware of the computer 1900, and the like. The flexible disk drive 2050 retrieves a program or data from a flexible disk 2090 and provides the hard disk drive 2040 with it via the RAM 2020. The I/O chip 2070 connects various I/O apparatus via a parallel port, a serial port, a keyboard port, a mouse port, and the like.

The program such as a diagnostic program provided to the hard disk drive 2040 via the RAM 2020 is stored in a recording medium such as the flexible disk 2090, the CD-ROM 2095, or an IC card and provided by the user. The program is retrieved from the recording medium, installed in the hard disk drive 2040 in the computer 1900 via the RAM 2020, and executed in the CPU 2000.

The program or the module described above may be stored in a recording medium of the outside. An optical recoding medium such as DVD, CD, etc., a magneto-optical recording medium such as MO, a tape medium, and a semiconductor medium such as an IC card can be used as the recoding medium in addition to flexible disk 2090 and the CD-ROM 2095. Further, a storing apparatus such as a hard disk or a RAM provided in a server system connected with a dedicated communication network and the internet may be used as the recording medium and provide the computer 1900 with the program through the network.

Figure 3:
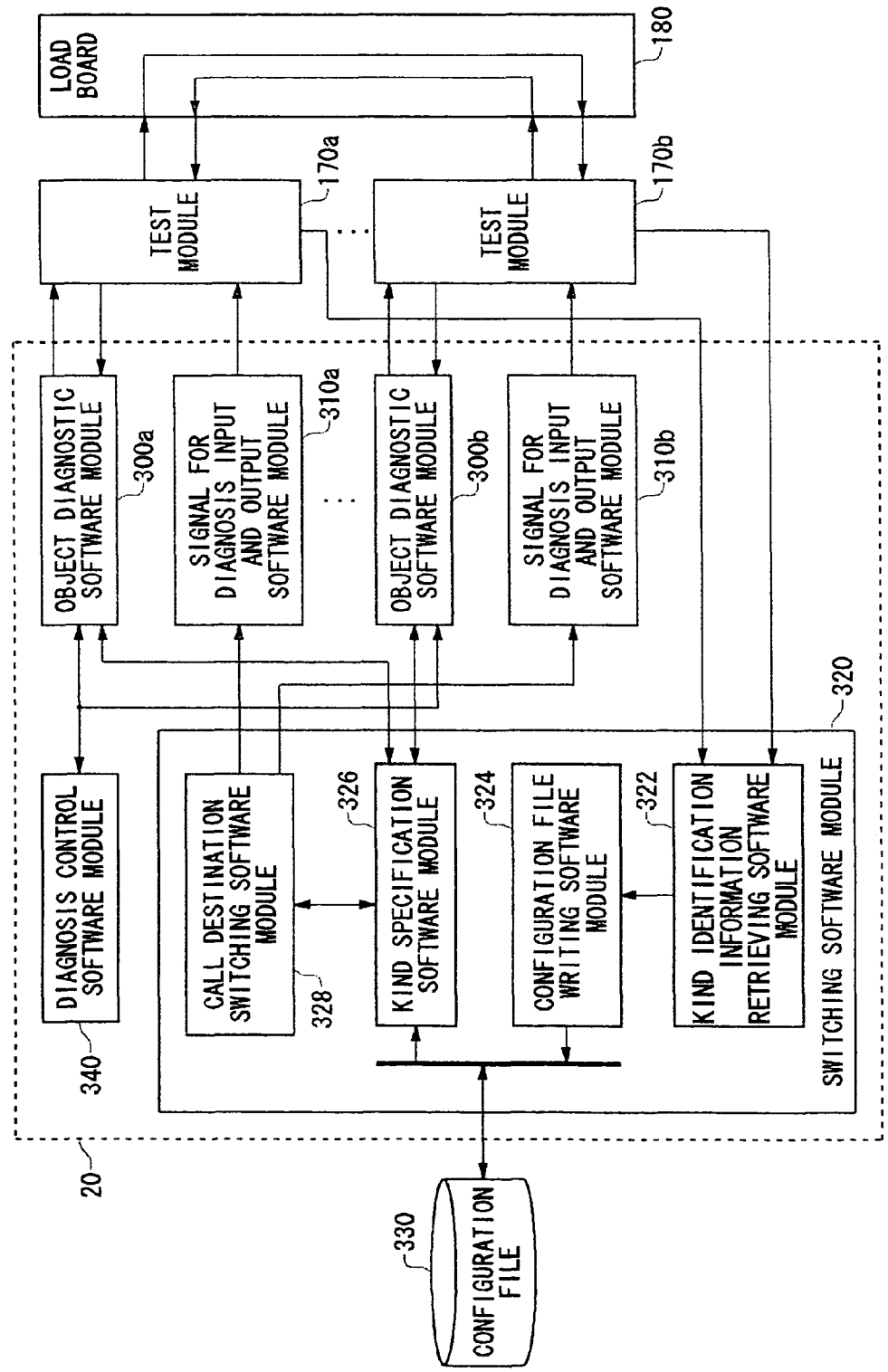
FIG. 3 shows the configuration of a diagnostic program 20 operating on the site control apparatus 130 according to the embodiment of the present invention.

FIG. 3 shows the configuration of a diagnostic program 20 operating on the site control apparatus 130 according to the present embodiment. The diagnostic program 20 is a program which makes the site control apparatus 130 diagnose the synchronization module 150, the synchronization connection module 160, and the test module 170. In the following, diagnosis of the test module 170 is explained as an example.

The diagnostic program 20 is executed by the site control apparatus 130 in a state where the load board for diagnosis 180 is mounted on the testing apparatus 10 and makes a signal for diagnosis transferred between the test module 170 which is a diagnostic object and a non-diagnostic test module 170 which is not the diagnostic object. Then, pass/fail of the I/O channel of the diagnostic object test module 170 is determined on the basis of the result of the transfer of the signal for diagnosis.

The diagnostic program 20 includes object diagnostic SW modules 300a and 300b, signal for diagnosis input and output SW modules 310a and 310b, a switching SW module 320, and a diagnosis control SW module 340. This kind of software module is executed by the CPU 2000 of the site control apparatus 130 and is a program for making the site control apparatus 130 perform a function of each of one or a plurality of object diagnostic sections, one or a plurality of signal for diagnosis input and output sections, a switching section, and a diagnosis control section.

One or each of the plurality of object diagnostic SW modules 300 (300a and 300b) is executed and makes the site control apparatus 130 diagnose the test module 170 which is an object to be diagnosed. The object diagnostic SW modules 300 is made out for every kind of test module 170 by a designer of the test module 170 and makes the site control apparatus 130 diagnose whether or not hardware of each part in the test module 170 operates normally. For the diagnostic process, the object diagnostic SW module 300 calls the signal for diagnosis input and output SW module 310 for controlling the test module 170 which is a non-diagnostic object via the switching SW module 320 and makes a signal for diagnosis transferred between the test module 170 which is a diagnostic object and the test module 170 which the non-diagnostic object. Then, the object diagnostic SW module 300 diagnoses the I/O channel of the diagnostic object test module 170 on the basis of the result of the transfer of the signal for diagnosis as pass or fail.

One or each of the plurality of object diagnostic SW modules 300 (300a and 300b) is provided in every kind of non-diagnostic object test module 170 which is not the object to be tested. Each of the signal for diagnosis input and output SW modules 310 is executed by the site control apparatus 130, and outputs a signal for diagnosis to the diagnostic object test module 170 or makes the site control apparatus 130 control the non-diagnostic object test module 170 so that the test signal output by the diagnostic object test module 170 is input.

The switching SW module 320 is executed by the site control apparatus 130, receives a call for instructing the diagnostic object test module 170 and the non-diagnostic object test module 170 to transfer a signal for diagnosis from the object diagnostic SW module 300, and calls the signal for diagnosis input and output SW module 310 for controlling the non-diagnostic object test module 170. The switching SW module 320 includes a kind identification information retrieving SW module 322, a configuration file writing SW module 324, a kind specification SW module 326, and a call destination switching SW module 328. This kind of program or SW module is executed by the CPU 2000 of the site control apparatus 130 and is a program for making the site control apparatus 130 perform a function of each of a kind identification information retrieving section, a configuration file writing section, a kind specification section, and a call destination switching section.

The kind identification information retrieving module 322 is executed by the site control apparatus 130 and makes the site control apparatus 130 retrieve kind identification information for identifying each of a plurality of test modules 170 included in the testing apparatus 10 from the test module 170. For each test module 170, the configuration file writing SW module 324 stores SW module identification information for identifying the signal for diagnosis input and output SW module 310 corresponding to the test module 170 in a configuration file 330 on the basis of the kind identification information retrieved by the kind identification information retrieving module 322. Here, the configuration file 330 is provided as, for example, a file on the hard disk drive 2040 and stores configuration information such as the kind of each test module 170 inserted in each slot of the testing apparatus 10 on the site control apparatus 130.

The kind specification SW module 326 is executed by the site control apparatus 130 and receives a call for instructing the diagnostic object test module 170 and the non-diagnostic object test module 170 to transfer a signal for diagnosis from the object diagnostic SW module 300. Then, the kind specification SW module 326 makes the site control apparatus 130 specify the signal for diagnosis input and output SW module 310 in response to the received call.

The call destination switching SW module 328 is executed by the site control apparatus 130 and makes the site control apparatus 130 call the signal for diagnosis input and output SW module 310 specified by the kind specification SW module 326. By this, the call destination switching SW module 328 makes the non-diagnostic object test module 170 receive from the diagnostic object test module 170 or send to the diagnostic object test module 170.

The diagnosis control SW module 340 is executed by the site control apparatus 130 and controls diagnosis of a plurality of test modules 170.

According to the diagnostic program shown in the above, it is not required to change the object diagnostic SW module 300 for diagnosing the test module 170 which is an object to be tested even in case a different test module is inserted in the testing apparatus 10 and the configuration of the testing apparatus 10 is changed. By this, the diagnostic program 20 can properly perform diagnosis process regardless of the kind of the test module 170 mounted on the testing apparatus 10.

Figure 4:
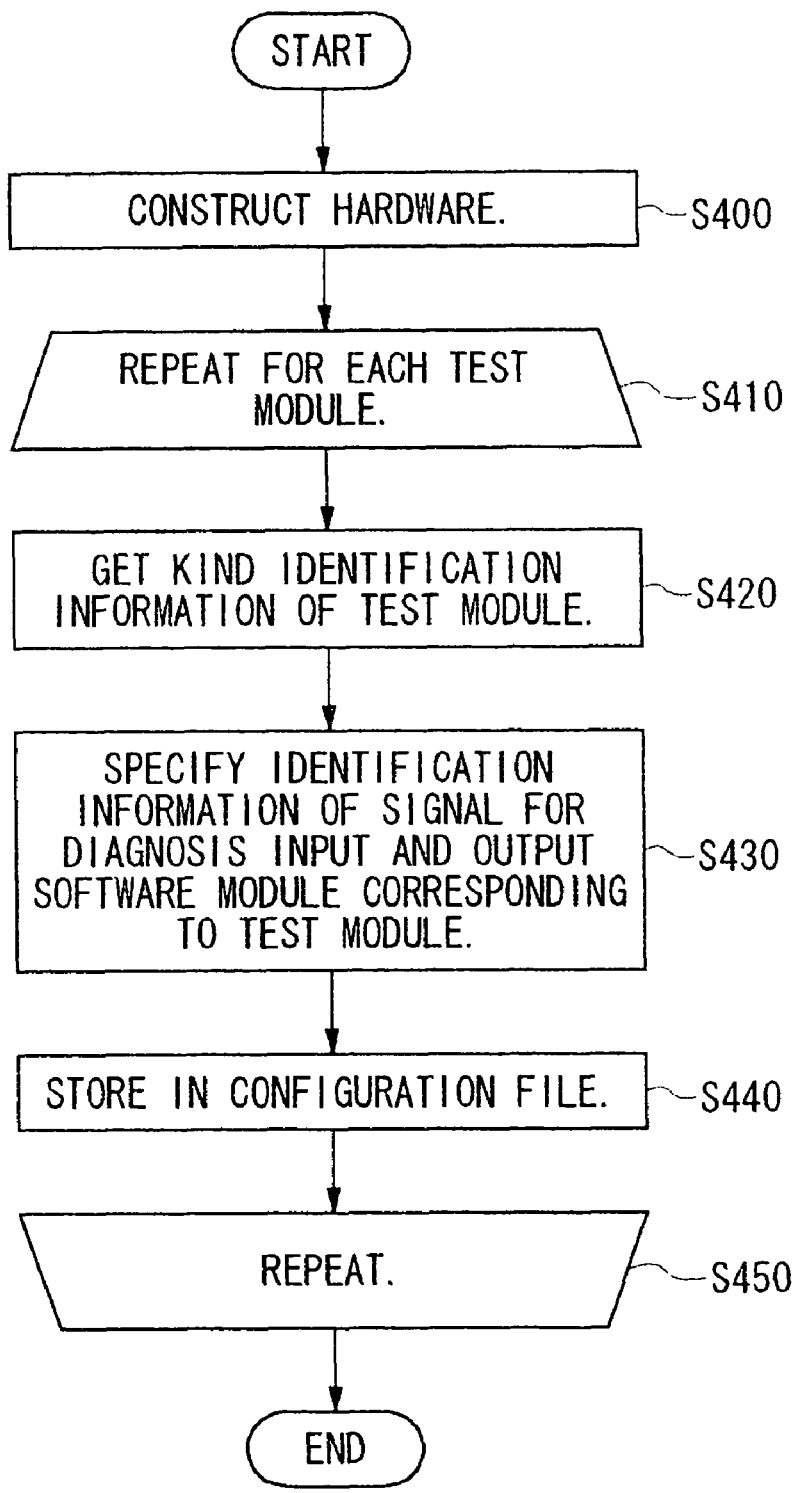
FIG. 4 shows a flow of making a configuration file 330 by the diagnostic program 20 according to the embodiment of the present invention.

FIG. 4 shows a flow of making the configuration file 330 by the diagnostic program 20 according to the present embodiment. First, each of the synchronization module 150, a synchronous connection module 160, and the test module 170 is inserted in a slot of the testing apparatus 10 and hardware of the testing apparatus 10 is constructed according to the DUT 100 which is an object to be tested (S400). Then, the diagnostic program is started for one or each of the plurality of site control apparatus 130 and diagnostic process is started. The diagnostic program 20 executed on each site control apparatus 130 performs the process of S420 to S440 for each of a plurality of test modules 170 corresponding to the site control apparatus 130 (S410, S450).

Then, the kind identification information retrieving SW module 322 makes the site control apparatus 130 get the kind identification information of the test module 170 stored in a register or a flash memory in the test module 170 which is an object to be tested (S420). The kind identification information may be information for identifying the product number of the test module 170 by its manufacturer, for example.

Then, the configuration file writing SW module 324 specifies SW identification information corresponding to the test module 170 on the basis of the kind identification information retrieved by the kind identification information retrieving SW module 322 (S430), and the information is stored in the configuration file 330 to correspond to the test module 170.

By performing the process of S420 to S440 for each of the plurality of test modules 170, the site control apparatus 130 can make the configuration file 330 showing the configuration of the test module 170 inserted in the testing apparatus 10. Instead, the user of the testing apparatus 10 may make the configuration file 330 by himself.

Figure 5:
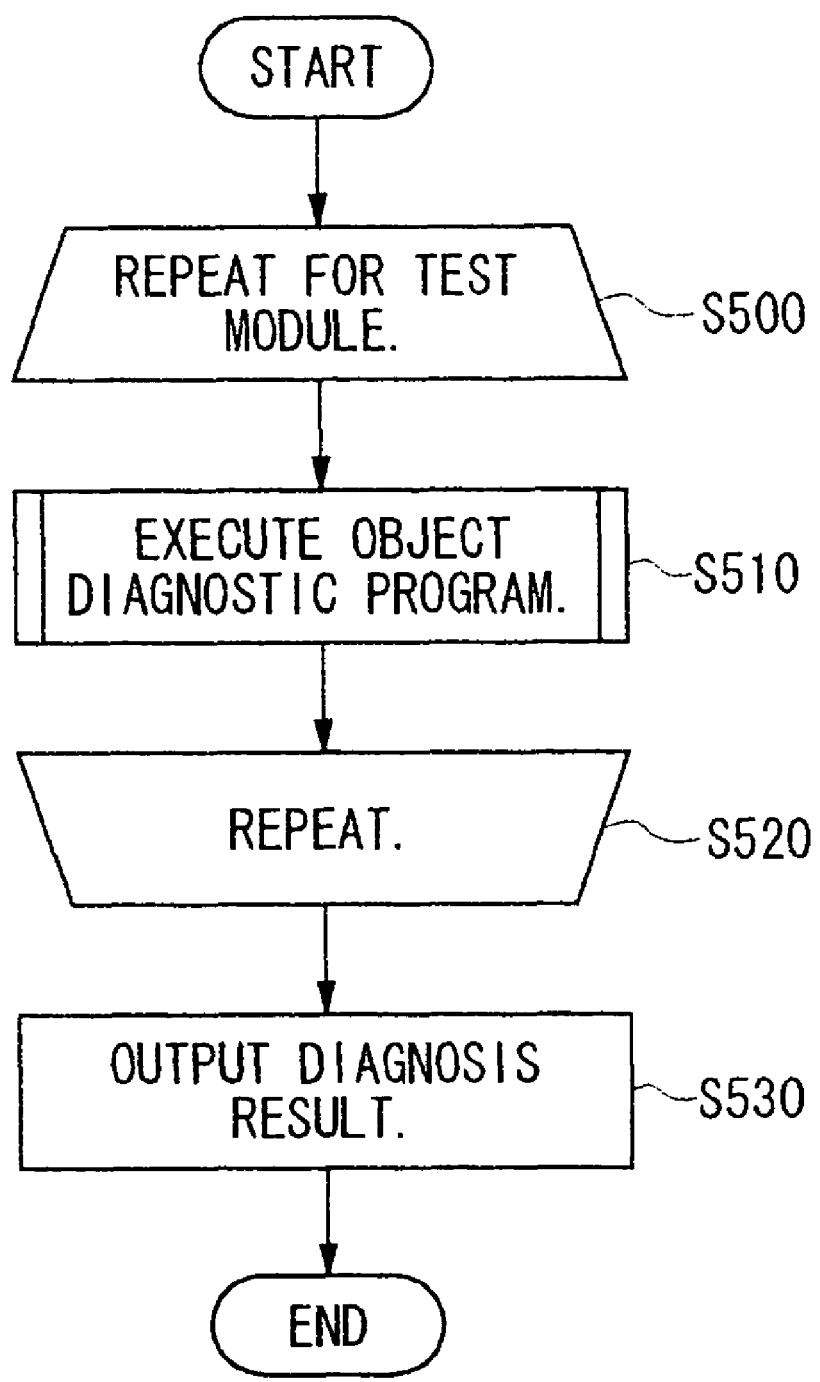
FIG. 5 shows a diagnosis flow of the testing apparatus 10 by the diagnostic program 20 according to the embodiment of the present invention.

FIG. 5 shows a diagnosis flow of the testing apparatus 10 by the diagnostic program 20 according to the present embodiment. When the construction of the configuration file 330 shown in FIG. 4 is completed, the diagnostic control SW module 340 executed on the site control apparatus 130 makes the object diagnosis SW module 300 executed sequentially for each of the plurality of test modules 170 (S510). By this, the diagnosis control SW module 340 makes the site control apparatus 130 diagnose sequentially each of the plurality of test modules 170 (S500, S520).

When diagnosis of all the test modules 170 is completed, the diagnosis control SW module 340 outputs the diagnosis result obtained from each of the object diagnostic SW modules 300 (S530). The user of the testing apparatus 10 can obtain information on whether or not the testing apparatus 10 properly operates and information for specifying the test module 170 which is defective on the basis of the diagnosis result.

Figure 6:
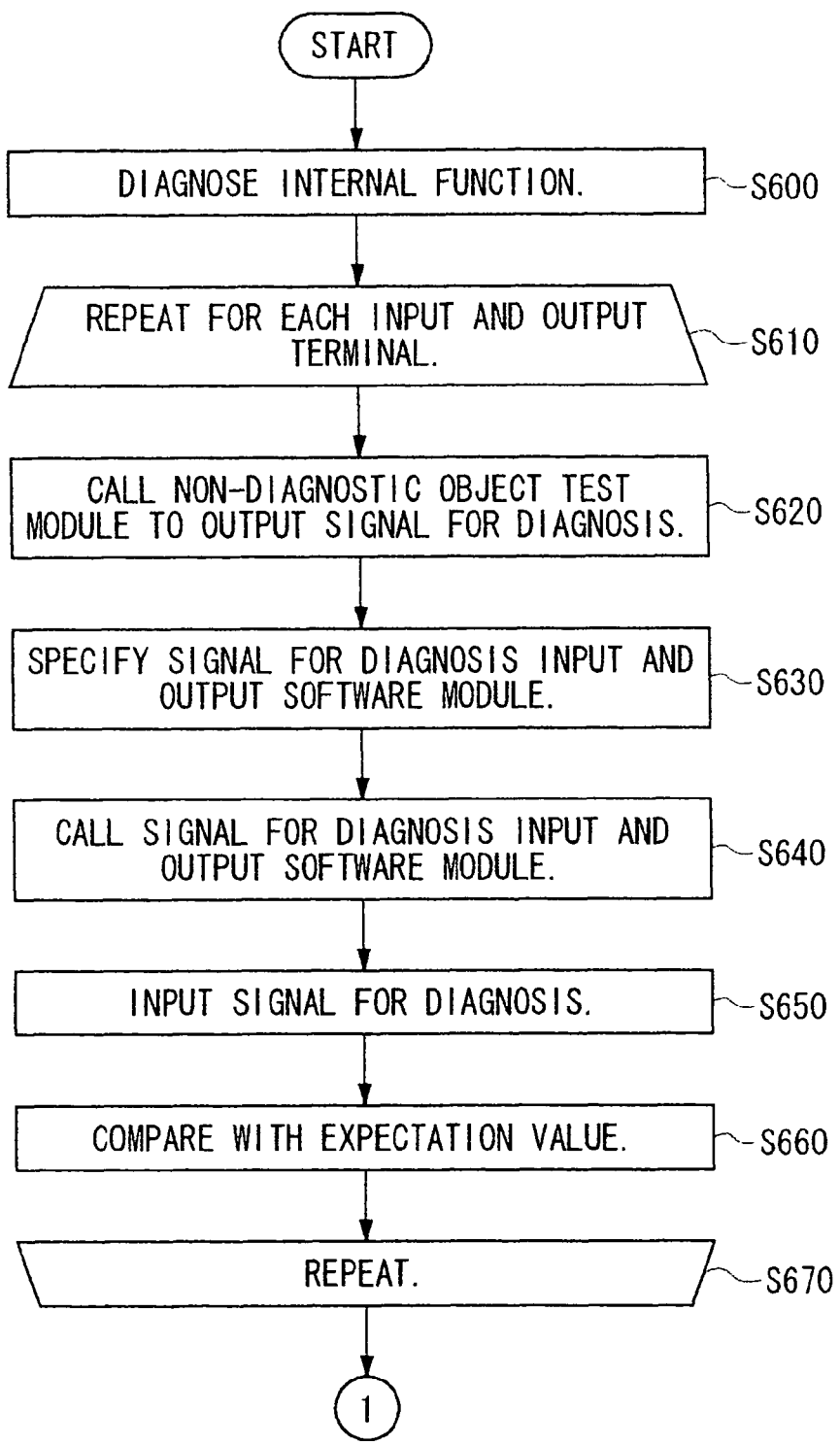
FIG. 6 shows the first half of an operation flow of S510 by the diagnostic program 20 according to the embodiment of the present invention.
Figure 7:
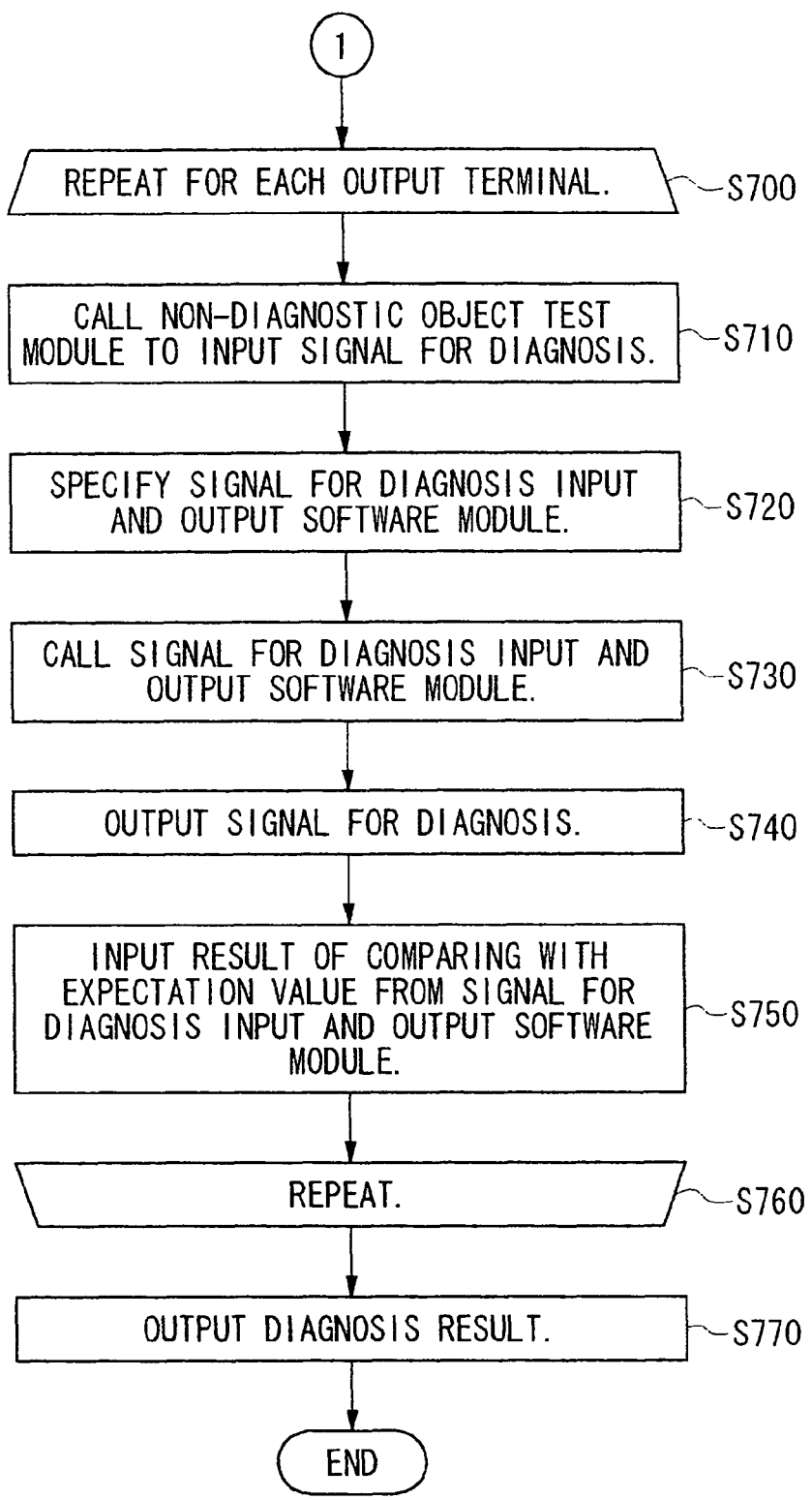
FIG. 7 shows the latter half of the operation flow of S510 by the diagnostic program 20 according to the embodiment of the present invention.

FIG. 6 shows an operation flow of S510 by the diagnostic program 20 according to the present embodiment. The object diagnostic SW module 300, the signal for diagnosis input and output SW module 310, and the switching module 320 in the diagnostic program 20 are executed on the site control apparatus 130 and thus perform the process shown in FIGS. 6 and 7 in S510 in FIG. 4.

First, the object diagnostic SW module 300 in the diagnostic program 20 diagnoses function of the inside of the test module 170 which is an object to be diagnosed (S600). Then, the diagnostic program 20 performs the process of S620 to S660 for one or each of the plurality of I/O terminals of the test module 170 which is the object to be tested (S610, S670).

For each of the input terminals, the object diagnostic SW module 300 calls to instruct the test module 170 connected with the input terminal which is a non-diagnostic object to output a signal for diagnosis by the site control apparatus 130 (S620). Then, the kind specification SW module 326 in the switching SW module 320 specifies the signal for diagnosis input and output SW module 310 corresponding to the kind of the test module 170 which is the non-diagnostic object appointed by the object diagnostic SW module 300 in response to the call by the site control apparatus 130 (S630). In other words, the kind specification SW module 326 specifies the kind of the non-diagnostic object test module 170 by the site control apparatus 130 and searches for the configuration file 330 by using the kind by the site control apparatus 130. Then, the switching apparatus 320 retrieves specification information of the signal for diagnosis input and output SW module 310 corresponding to the non-diagnostic object test module 170 of the kind.

For example, the object diagnostic SW module 300 specifies a module number of the test module 170 of which output terminal is connected with the input terminal of the test module 170 which is the diagnostic object from the position of the slot of the test module 170 and the like. Then, the object diagnostic SW module 300 may call the switching SW module 320 by using a parameter including the module number, the number of output terminals in the test module 170, and the like. In this case, the kind specification SW module 326 specifies the non-diagnostic object test module 170 to which the module number is assigned on the basis of the module number and specifies the signal for diagnosis input and output SW module 310 corresponding to the non-diagnostic object test module 170. Instead, the object diagnostic SW module 300 may select the configuration for calling the switching SW module 320 by using the parameter including the information for specifying the input terminal of the test module 170 which is the diagnosis object. In this case, on the basis of the module number of the diagnosis object test module 170 and the information of the I/O terminal in the test module 170, the switching SW module 320 specifies the test module 170 including an output terminal connected with the input terminal. Then, the switching SW module 320 specifies the signal for diagnostic input and output SW module 310 corresponding to the kind of the test module 170.

Further, the kind specification SW module 326 may specify more than two signal for diagnosis input and output SW modules 310 which control each of more than two test modules 170 of the same kind or different kinds for one call from the object diagnostic SW module 300.

Further, in case one non-diagnostic object test module 170 outputs a signal for diagnosis by making more than two signal for diagnosis input and output SW modules 310 executed on the site control apparatus 130, the kind specification SW module 326 may specify more than two signal for diagnosis input and output SW modules 310 for one call from the object diagnostic SW module 300.

Then, the call destination switching SW module 328 calls the signal for diagnosis input and output SW module 310 specified by the kind specification SW module 326 (S640). The signal for diagnosis input and output SW module 310 receiving the call controls the non-diagnostic object test module 170 which is an object to be controlled and makes the non-diagnostic object test module 170 output a signal for diagnosis to the diagnostic object test module 170 (S650).

Here, the call destination switching SW module 328 may call more than two signal for diagnosis input and output SW modules 310 which control each of more than two test modules 170 of the same kind or different kinds for one call from the object diagnostic SW module 300. As an example, in case the object diagnostic SW module 300 instructs more than two test modules 170 to be reset or a signal for diagnosis to be provided synchronously to the diagnostic object test module 170 from more than two non-diagnostic object test modules 170, the call destination switching SW module 328 calls more than two signal for diagnosis input and output SW modules 310.

Further, in case one non-diagnostic object test module 170 outputs a signal for diagnosis by making more than two signal for diagnosis input and output SW modules 310 executed on the site control apparatus 130, the call destination switching SW module 328 makes the site control apparatus 130 call sequentially more than two signal for diagnosis input and output SW modules 310 in response to the call from the object diagnostic SW module 300. By this, the call destination switching SW module 328 makes the non-diagnostic test module 170 output a signal for diagnostic by the process of more than two signal for diagnosis input and output SW modules 310.

Then, the object diagnostic SW module 300 compares the signal for diagnosis input by the diagnostic object test module 170 with an expectation value and diagnoses the input channel of the diagnostic object test module 170 as pass or fail (S660).

The diagnostic program 20 is executed by the site control apparatus 130 and thus performs the process of S620 to S660 for each input terminal of the diagnostic object test module 170. Thus, the diagnostic program 20 can diagnose each input channel of the diagnostic object test module 170.

Then, the diagnostic program 20 performs the process of S710 to S750 for one or each of a plurality of output terminals of the test module 170 which is an object to be diagnosed (S700, S760). Here, since the process of S710 to S750 for the output terminal corresponds to the process of S620 to S660 for the input terminal, only differences of the process of S710 to S750 form the process of S620 to S660 are described in the following.

For each out terminal, the object diagnostic SW module 300 makes the site control apparatus 130 call to instruct the synchronization module 150 which is an non-diagnostic object and which is connected to the output terminal, the synchronous connection module 160, or the test module 170 to input a signal for diagnosis (S710). Then, in response to the call, the kind specification SW module 326 in the switching SW module 320 specifies the signal for diagnosis input and output SW module 310 corresponding to the kind of the test module 170 which is a non-diagnostic object assigned by the object diagnostic SW module 300 by the site control apparatus 130 (S720). Here, the kind specification SW module 326 may specify more than two signal for diagnosis input and output SW modules 310 which control more than two test modules 170 of the same kind or different kinds for the call from the object diagnostic SW module 300. Further, in case one non-diagnostic object test module 170 inputs a signal for diagnosis by making more than two signal for diagnosis input and output SW modules 310 executed on the site control apparatus 130, the kind specification SW 326 may specify more than two signal for diagnosis input and output SW modules 310 in response to the call from the object diagnostic SW module 300.

Then, the call destination switching SW module 328 calls the signal for diagnosis input and output SW module 310 specified by the kind specification SW module 326 (S730). The signal for diagnosis input and output SW module 310 receiving the call controls the non-diagnostic object test module 170 which is an object to be controlled and make the signal for diagnosis output from the diagnostic object test module 170 to the diagnostic object test module 170 be in a state of being able to be input. In this state, the object diagnostic SW module 300 controls the diagnostic object test module 170 and makes the diagnostic object test module 170 output a signal for diagnostic (S740).

Here, the call destination switching SW module 328 may call more than two signal for diagnosis input and output SW modules 310 which control more than two test modules 170 of the same kind or different kinds for one call from the object diagnostic SW module 300. As an example, in case of inputting synchronous signals output to more than two test modules 170 from the synchronous connection module 160 which is an object to diagnosed to the more than two test modules 170, the call destination switching SW module 328 calls more than two signal for diagnosis input and output SW modules 310.

Further, in case one non-diagnostic object test module 170 inputs a signal for diagnosis by making more than two signal for diagnosis input and output SW modules 310 executed on the site control apparatus 130, the call destination switching SW 328 may specify more than two signal for diagnosis input and output SW modules 310 in response to the call from the object diagnostic SW module 300 by the site control apparatus 130. By this, the call destination switching SW 328 makes the diagnostic object test module 170 input the signal for diagnosis by the process of more than two signal for diagnosis input and output SW modules 310.

Then, the signal for diagnosis input and output SW modules 310 compared the signal for diagnosis input to the non-diagnostic object test module 170 with an expectation value and diagnoses the output channel of the diagnostic object test module 170 as pass or fail (S750).

The diagnostic program 20 is executed on the site control apparatus 130 and thus performs the process of S710 to S750 shown in the above for each output terminal of the diagnostic object test module 170. By this, the diagnostic program 20 can diagnose each output channel of the diagnostic object test module 170.

Then, the diagnostic program 20 outputs the result of diagnosing the function the inside of the diagnostic object test module 170 (S600), the result of diagnosing each input channel (S610 to S670), and the result of diagnosing each output channel to the user of the testing apparatus 10. The user of testing apparatus 10 receiving the results can change the test module which is defective and hold the testing apparatus 10 normally operating.

When the testing apparatus 10 is turn on or the user instructs the testing apparatus 10 to perform a diagnostic process, for example, the site control apparatus 130 performs the diagnostic process as above. Then, after the diagnostic process, the testing apparatus 10 may perform testing on one or a plurality of DUTs 100.

Although the present invention has been described by way of exemplary embodiments, it should be understood that those skilled in the art might make many changes and substitutions without departing from the spirit and the scope of the present invention which is defined only by the appended claims.

For example, the object diagnostic SW module 300 and the signal for diagnosis input and output SW module 310 shown in the above may be provided to correspond to each test module 170 and mounted separately from a SW module for testing which controls the corresponding test module 170 during testing. Instead, the object diagnostic SW module 300 and the signal for diagnosis input and output SW module 310 may be combined with a SW module for testing and embodied as a part of function of the SW module.

Further, since the synchronization module 150 and the synchronous connection module 160 are also used to provide the DUT 100 with a signal for testing, the diagnostic program 20 may perform diagnosis of them similarly with the test module 170. In other words, the diagnostic program 20 may diagnose other modules such as the synchronization module 150 and the synchronous connection module 160 similarly with the test module 170. Further, the diagnostic program 20 may transfer a signal for diagnosis between the diagnostic object test module 170 and the non-diagnostic object test module, that is, other modules such as the synchronization module 150 and the synchronous connection module 160.

What is claimed is:

1. A computer readable medium containing a diagnostic program for instructing a testing apparatus comprising a plurality of test modules, including a diagnostic object test module and a non-diagnostic object test module, for providing a device under test with a test signal and a control apparatus for controlling the plurality of test modules, the diagnostic program for instructing the test apparatus to diagnose the plurality of test modules, the diagnostic program comprising:

a first software module for making the control apparatus diagnose the diagnostic object test module;

a plurality of second software modules which are provided in the control apparatus, one of said plurality of second software modules corresponding to the type of the non-diagnostic object test module, and which make the control apparatus control the non-diagnostic object test module to receive through an input channel a signal for diagnosis output by the diagnostic object test module or to output a signal for diagnosis through an output channel to the diagnostic object test module;

a third software module for making the control apparatus specify the second software module that corresponds to the type of the non-diagnostic object test module, in response to a call received from said first software module which instructs said third software module to receive the signal for diagnosis from or send the signal for diagnosis to the non-diagnostic object test module; and a fourth software module for making the control apparatus call the second software module specified by said third software module, making the diagnostic object test module input the signal for diagnosis to the non-diagnostic object test module, or making the non-diagnostic object test module output the signal for diagnosis to the diagnostic object test module.

2. The computer readable medium as claimed in claim 1, wherein said third software module searches for a configuration file, which is stored on the control apparatus, storing software module identification information for identifying, from among said plurality of second software modules, a second software module corresponding to each of the plurality of test modules of the testing apparatus and retrieves the identification information of the second software module corresponding to the non-diagnostic object test module.

3. The computer readable medium as claimed in claim 2, further comprising:

a fifth software module for making the control apparatus retrieve type identification information stored in the plurality of test modules, the type identification information identifying the type of each of the plurality of test modules of the testing apparatus; and a sixth software module for storing in the configuration file software module identification information for identifying the second software module corresponding to each of the plurality of test modules on the basis of the type identification information retrieved by said fifth software module for each of the plurality of test modules of the testing apparatus.

4. The computer readable medium as claimed in claim 1, wherein, in case the non-diagnostic object test module causes more than two second software modules executed on the control apparatus to receive or send the signal for diagnosis, said fourth software module makes the control apparatus sequentially call said more than two second software modules in response to a call for instructing it to receive/send the signal for diagnosis from/to the non-diagnostic object test module.

5. A computer readable medium containing a switching program for instructing a testing apparatus to function as a diagnostic apparatus when executed, the testing apparatus comprising a plurality of test modules, including a diagnostic object test module and a non-diagnostic object test module, for providing a device under test with a test signal and a control apparatus for controlling the plurality of test modules, the switching program switching a second software module, from among a plurality of second software modules, for making the control apparatus control the non-diagnostic object test module and which is called from a first software module for making the control apparatus diagnose the diagnostic object test module, wherein said plurality of second software modules are provided in the control apparatus, one of said plurality of second software modules corresponding to the type of the non-diagnostic object test module, and make the control apparatus control the non-diagnostic object test module to receive through an input channel a signal for diagnosis output by the diagnostic object test module, and the switching program comprises:

a third software module for making the control apparatus specify the second software module that corresponds to the type of the non-diagnostic object test module, in response to a call received from said first software module which instructs said third software module to receive the signal for diagnosis from or send the signal for diagnosis to the non-diagnostic object test module; and a fourth software module for making the control apparatus call the second software module specified by said third software module, making the diagnostic object test module input the signal for diagnosis to the non-diagnostic object test module, or making the non-diagnostic object test module output the signal for diagnosis to the diagnostic object test module.

6. A testing apparatus for testing a device under test comprising:

a plurality of test modules for providing the device under test with a test signal; and a control apparatus for controlling the plurality of test modules, wherein said control apparatus executes a diagnostic program for diagnosing a test module from among the plurality of test modules and thus performs a function of:

a first section for making said control apparatus diagnose a diagnostic object test module from among the plurality of test modules;

a plurality of second sections which are provided in the control apparatus, one of said plurality of second sections corresponding to the type of a non-diagnostic object test module from among the plurality of test modules, and which make the non-diagnostic object test module output a signal for diagnosis to the diagnostic object test module through an output channel or receive a signal for diagnosis output by the diagnostic object test module through an input channel;

a third section for making said control apparatus specify the second section that corresponds to the type of the non-diagnostic object test module, in response to a call received from the first section which instructs the third section to receive the signal for diagnosis from or send the signal for diagnosis to the non-diagnostic object test module; and a fourth section for making said control apparatus call the second section specified by said third section, making the diagnostic object test module input the signal for diagnosis to the non-diagnostic object test module, or making the non-diagnostic object test module output the signal for diagnosis to the diagnostic object test module, wherein said first section compares the signal for diagnosis output from or input to the diagnostic object test module with an expectation value and diagnoses the input or output channel of the diagnostic object test module as pass or fail.

7. A diagnostic method performed by a testing apparatus comprising a plurality of test modules for providing a device under test with a test signal and a control apparatus for controlling the plurality of test modules, the diagnostic method for diagnosing, by the control apparatus, the plurality of test modules and comprising:

diagnosing, by the control apparatus, a diagnostic object test module from among the plurality of test modules;

controlling, by the control apparatus, a non-diagnostic object test module from among the plurality of test modules to receive through an input channel a signal for diagnosis output by the diagnostic object test module;

specifying, by the control apparatus, the controlling step, which corresponds to the type of the non-diagnostic object test module, in response to an instruction received during said diagnosing step to receive the signal for diagnosis from or send the signal for diagnosis to the non-diagnostic object test module; and calling, by the control apparatus, the controlling step specified by said specifying step, inputting, by the diagnostic object test module, the signal for diagnosis to the non-diagnostic object test module, or outputting, by the non-diagnostic object test module, the signal for diagnosis to the diagnostic object test module, wherein said diagnosing step comprises comparing the signal for diagnosis output from or input to the diagnostic object test module with an expectation value and diagnosing an input or output channel of the diagnostic object test module as pass or fail.

* * * * *